(12) United States Patent
Fairbourn et al.

(10) Patent No.: US 9,139,903 B2
(45) Date of Patent: Sep. 22, 2015

(54) CHEMICAL VAPOR DEPOSITION OF METAL LAYERS FOR IMPROVED BRAZING

(75) Inventors: David C. Fairbourn, Sandy, UT (US); Richard Patrick Chesnes, Cincinnati, OH (US)

(73) Assignee: Aeromet Technologies, Inc., Sandy, UT (US)

( * ) Notice: Subject to any disclaimer, the term of this patent is extended or adjusted under 35 U.S.C. 154(b) by 15 days.

(21) Appl. No.: 13/698,651

(22) PCT Filed: May 17, 2011

(86) PCT No.: PCT/US2011/036894
§ 371 (c)(1),
(2), (4) Date: Nov. 18, 2012

(87) PCT Pub. No.: WO2011/146547
PCT Pub. Date: Nov. 24, 2011

(65) Prior Publication Data
US 2013/0059084 A1    Mar. 7, 2013

Related U.S. Application Data

(60) Provisional application No. 61/345,452, filed on May 17, 2010, provisional application No. 61/347,260, filed on May 21, 2010.

(51) Int. Cl.
*C23C 16/02* (2006.01)
*B23K 35/02* (2006.01)
(Continued)

(52) U.S. Cl.
CPC ......... *C23C 16/0227* (2013.01); *B23K 35/0238* (2013.01); *C23C 10/02* (2013.01); *C23C 10/28* (2013.01); *C23C 10/60* (2013.01);
(Continued)

(58) Field of Classification Search
CPC ................................................... B23K 35/0238
USPC ............................................................. 427/319
See application file for complete search history.

(56) References Cited

U.S. PATENT DOCUMENTS 3,764,371 A * 10/1973 Baldi ............................ 427/253
4,202,537 A *  5/1980 Kawasoko et al. ........... 266/252
(Continued)

FOREIGN PATENT DOCUMENTS

| EP | 1437425 A1 | 7/2004 |
| EP | 1652613 A1 | 5/2006 |
| GB | 2421032 A  | 6/2006 |

OTHER PUBLICATIONS

EPO—Extended European Search Report including the supplementary European search report and the European search opinion from corresponding Application No. 11784127.0-1353 / 2572015 PCT/US2011036894.

*Primary Examiner* — Nathan T Leong
(74) *Attorney, Agent, or Firm* — David Lee Narciso

(57) ABSTRACT

A method of forming a metallic wetting layer on the surface of a metal component is provided, including the steps of placing the component into a chemical vapor deposition furnace, placing a metal-containing salt in the furnace, and heating the component and the metal-containing salt in the furnace to cause the metal from the metal-containing salt to deposit in a coating on the surface of the component forming a metallic wetting layer that improves the metallic bond of a subsequently applied brazing material. The process can be practiced with the addition of a cleaning reagent to both clean and coat in one operation.

27 Claims, 1 Drawing Sheet

(51) Int. Cl.
*C23C 16/14* (2006.01)
*F01D 5/00* (2006.01)
*F01D 5/28* (2006.01)
*C23C 10/02* (2006.01)
*C23C 10/28* (2006.01)
*C23C 10/60* (2006.01)

(52) U.S. Cl.
CPC ............... *C23C 16/14* (2013.01); *F01D 5/005* (2013.01); *F01D 5/288* (2013.01); *F05D 2230/314* (2013.01)

(56) References Cited

U.S. PATENT DOCUMENTS

| | | | |
|---|---|---|---|
| 6,224,682 | B1 | 5/2001 | Wall et al. |
| 6,294,072 | B1 | 9/2001 | Fairbourn |
| 7,846,261 | B2 | 12/2010 | Chesnes et al. |
| 2005/0000425 | A1* | 1/2005 | Fairbourn ................ 118/715 |
| 2010/0032472 | A1* | 2/2010 | Heinecke et al. ............ 228/227 |

* cited by examiner

CHEMICAL VAPOR DEPOSITION OF METAL LAYERS FOR IMPROVED BRAZING

CROSS REFERENCE TO RELATED APPLICATIONS

This application is the US National Stage of International Application No. PCT/US2011/036894, filed May 17, 2011, which in turn claims the benefit of U.S. Provisional Patent Application Ser. No. 61/345,452, filed May 17, 2010, and of U.S. Provisional Patent Application Ser. No. 61/347,260, filed May 21, 2010, all of which are incorporated by reference in their entirety.

TECHNICAL FIELD

The present invention is directed to a simple chemical vapor deposition (CVD) process for depositing a metal coating onto a metal component to form a metallic wetting layer that facilitates wetting of subsequently applied brazing alloy, including cleaning the metal component during the process so as to deposit onto a cleaned metal component.

BACKGROUND

Components of high temperature turbine engines are often manufactured from nickel-, cobalt-, or iron-based superalloy materials, which are recognized as providing greater shape retention and strength retention over a wider range of operating temperatures than other candidate materials for these applications. Although superalloy materials exhibit improved mechanical properties at high operating temperatures, they are nonetheless susceptible to high temperature oxidation, hot corrosion, and stress corrosion cracking. While the efficiency of a turbine engine generally increases with increasing operating temperature, the ability of superalloy materials to operate at such increased temperatures is limited by the ability to withstand such oxidation and corrosion.

Generally, gas turbine engines, such as jet engines and industrial gas turbine engines, include a compressor, with shaft-mounted compressor blades, for compressing incoming air, a combustor for mixing the compressed air with fuel, such as jet fuel or natural gas, and igniting the mixture, and a turbine section, including stationary vanes and rotating turbine blades mounted on the same shaft to drive the compressor. An additional turbine shaft from a second turbine section can drive a fan in a jet engine or a power generator in an industrial gas turbine engine. In particular, gas turbine engines operate by drawing air into the front of the engine. The air is then compressed, mixed with fuel, and combusted. Hot combustion gases from the combusted mixture expand through the turbine, rotating the turbine blades and thereby powering the compressor. The hotter the combustion and exhaust gases, the more efficient is the operation of the jet engine. There is thus an incentive to raise the combustion and exhaust gas temperatures. The maximum temperature of the combustion gases is normally limited by the materials used to fabricate the turbine vanes and turbine blades of the turbine, upon which the hot combustion gases impinge. In current engines, the turbine vanes and blades are typically made of nickel-based superalloys.

External surfaces of superalloy turbine engine components, which may experience direct contact with the hot combustion gases, are susceptible to high temperature oxidation and hot corrosion that accelerates the oxidation process. These external surfaces are frequently provided with an intermetallic or aluminide overlayer or diffusion coating that protects the underlying superalloy material against high temperature oxidation and hot corrosion by forming a stable thermal oxide scale. High temperature oxidation and hot corrosion, if the temperature is sufficiently high, may form corrosive deposits which attack and degrade the protective oxide scale.

In addition to the oxidation and corrosion brought on by exposure to elevated temperatures, vane segments or buckets of the turbine engines are subject to extreme cyclic stresses. The flow of the gases through the engine creates variation in pressure in the engine that causes cyclic flexing of each vane. Due to the high rotor assembly rotation rates, vane segments are subject to continuous cyclic stresses that cause cracks to appear in the surface of the vane segment. This is called stress corrosion cracking. Generally, for vane segments, cracks often appear on the trailing edges and in the fillet radius of the vane segment where it connects to the buttress walls.

These cracks are repaired where possible because of the significant cost associated with manufacturing new turbine engine components. In general, the repair process includes cleaning the component and then filing the cracks with a brazing compound. Specifically, the protective coatings are initially stripped from the incoming turbine engine component. Following stripping, it is customary to tumble the parts to remove any residual material or so-called "smut" from the component prior to rinsing the component. Once completely stripped, the parts are submitted to Fluoride Ion Cleaning (FIC), usually in a dynamic FIC system, which relies on the high reactivity of fluorine or fluoride ions for cleaning the exterior surface of the component. FIC cleaning is an extremely hazardous and environmentally unfriendly method of cleaning turbine engine components. In this process, hydrofluoric acid (HF) gas is heated in a retort chamber. The vaporized HF gas attacks any oxides present on the surface of the stripped component. The fluoride ion dissolves any oxides, usually in the form of a spinel, from inside the cracks.

Following FIC cleaning, the components are removed from the furnace and immediately placed into a vacuum furnace. The volatile fluorides are vacuumed off by heating them to a temperature where they are either liquid or gas and then subjecting the components to a vacuum of $10^{-5}$ Torr or $10^{-6}$ Torr to remove the liquid or gas residue.

Following vacuum cleaning, any cracks are filled with a braze alloy that closely approximates the chemical makeup of the alloy. The brazing alloy composition is formulated such that it contains a eutectic melting constituent called "low melt." In other words, the melting temperature of the brazing alloy is lower than the melting temperature of the component being joined.

As is known in the art, brazing is a metal-joining process in which two or more metallic parts are joined together by heating a brazing metal or alloy in contact with the parts to be joined. The brazing alloys generally melt above about 450° C. (about 840° F.) but below the melting temperature of the part. These temperatures are higher than those normally encountered in soldering operations. The molten brazing alloy is distributed between two or more close-fitting metal parts often by capillary action. The molten brazing alloy wets the components and may alloy with a thin layer of the bulk metal of the components.

In the case of crack repair, subsequent heat treatment of the braze-filled crack allows the brazing compound to flow within the crack and alloy with the surrounding bulk metal, essentially healing the crack. Wetting of the component by the brazing alloy is necessary to form a metallic bond between the brazing alloy and the part. However, poor cleaning or preparation of the component, including the region of the crack may inhibit wetting of the crack surfaces with the molten brazing compound resulting in an unbonded or a weakly bonded crack.

As is known in the art, chemical characteristics of the part's surface directly affect the quality of the braze joint. For instance, poor surface chemistry and/or surface contamination can negatively impact the strength of the braze joint because the braze alloy may not wet the surface to the degree necessary to form a strong joint. "Wetting" refers to the tendency of a molten material to spontaneously spread along a surface. To improve consistency and quality of braze joints, a coating of metal that is known to allow the molten braze alloy to wet it and thereby improve the wetting of the molten braze alloy with the metal part is often placed onto the part prior to brazing.

These pre-brazing coatings are often deposited by electroplating techniques. Electroplating requires a plating solution that contains the metal that is to be plated. These solutions are typically composed of multiple chemicals that must be monitored and adjusted during operation to obtain consistent quality platings. Accordingly, the complexity of the solution often leads to process control issues that ultimately results in inconsistent quality coatings. In addition, as is known in the art, plating operations often produce harmful or toxic byproducts and/or waste streams, like depleted plating solution, that require special handling and for which there are stringent disposal standards.

Consequently, there is a need for method of preparing metallic components for subsequent brazing in a manner that is more environmentally friendly and that includes forming a metallic wetting layer that is more consistent.

SUMMARY

A method of forming a metallic wetting layer on the surface of a metal component is provided, including the steps of placing the component into a chemical vapor deposition furnace, placing a metal-containing salt in the furnace, and heating the component and the metal-containing salt in the furnace to cause the metal from the metal-containing salt to deposit in a coating on the surface of the component forming a metallic wetting layer that improves the metallic bond of a subsequently applied brazing material.

In another embodiment, a method of forming a metallic wetting layer includes a cleaning operation in the same chemical vapor deposition furnace cycle, including placing the component into a furnace, placing a cleaning reagent and a metal-containing salt in the furnace, heating the component, the cleaning reagent, and the metal-containing salt in the furnace to a first temperature at which the reagent evolves a cleaning constituent that at least partially reacts with contaminants on the surface of the component, such that contaminants on the surface at least partially react and are at least partially removed from the surface, then after cleaning the temperature is raised with further heating until the metal-containing salt evolves metal that deposits on the surface of the component to form a metallic wetting layer.

A further method is provided for cleaning a used gas turbine engine component that contains cracks and that has previously been subject to a stripping process. The surface of the component is polished, including regions including cracks, and the component is placed in a furnace. A cleaning reagent and a metal-containing salt is placed in the furnace and the amount of oxygen is reduced to less than the atmospheric partial pressure of oxygen. The component, the cleaning reagent, and the metal-containing salt is heated in the oxygen-reduced atmosphere to a first temperature that causes the cleaning reagent to evolve a cleaning constituent that at least partially reacts with contaminants on the surface of the component such that the contaminants are removed from the surface. After cleaning, the temperature is raised by further heating to a second temperature that causes the metal-containing salt to evolve metal which then deposits in a coating on the cleaned surface of the component. The coating forms a metallic wetting layer.

BRIEF DESCRIPTION OF THE DRAWINGS

The accompanying drawings, which are incorporated in and constitute a part of this specification, illustrate embodiments of the invention and together with the detailed description given below, serve to explain various aspects of the invention.

DETAILED DESCRIPTION

Figure 1:
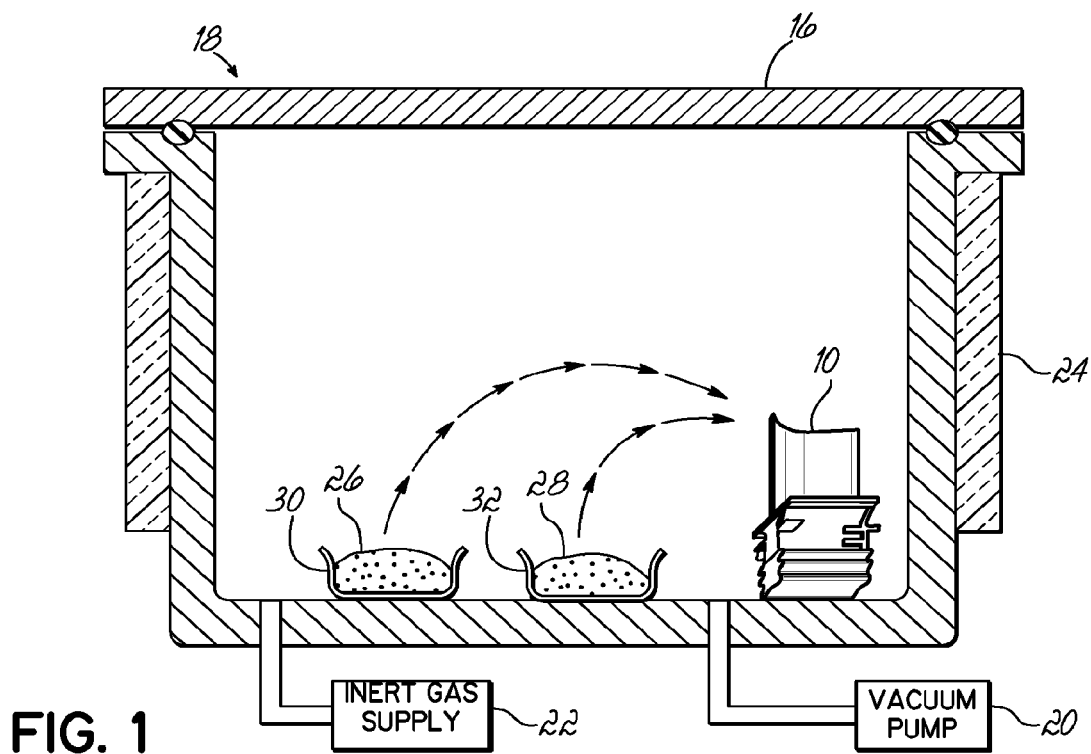
FIG. 1 is a diagrammatic view of a CVD system in accordance with the principles of the invention.
Figure 2:
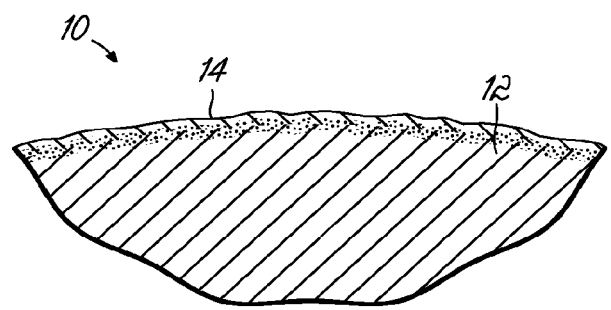
FIG. 2 is a diagrammatic cross-sectional view of a component with a metallic wetting layer in accordance with the principles of the present invention.

With reference generally to FIGS. 1 and 2, one method of the present invention includes cleaning the surface of a metallic component 10 and then forming a metallic wetting layer 14 on and/or in a cleaned metallic surface 12. In an alternative method, a clean metallic component 10 is provided and the method only forms the metallic wetting layer 14. To that end, embodiments of the present invention include using a simple CVD process to both (i) clean the surface of the metallic component 10 and/or (ii) form the metallic wetting layer 14 by depositing a metal coating thereon. In simple CVD, vapor is generated inside the CVD reactor chamber 16, not external thereto as in dynamic CVD. The metal coating may subsequently be diffused into the surface of the metallic component 10 to form the metallic wetting layer 14. Cleaning the surface is accomplished by first heating a cleaning reagent in the presence of the metal component 10 to at least a first temperature, while forming the metallic wetting layer 14 includes heating the metal component 10 and a metal salt to a second temperature greater than the first temperature. It will be clear to one of skill in the art that the cleaning step may be skipped if the metal component 10 has been cleaned in a separate operation.

According to embodiments of the present invention, cleaning of the metal component 10 and/or depositing of the metal coating may take place in the same chamber 16 or retort of a CVD system. By way of example, the metallic component 10 may be a turbine engine component made of a superalloy, as shown. While reference is made to turbine engine components herein, embodiments of the present invention may include other metallic components that are to be brazed together, such as, automotive components.

In one embodiment, the process includes placing a metallic component 10 into the chamber 16 of a CVD system 18. This may include, for example, placing a superalloy turbine engine component within a retort or vacuum furnace 16. The system 18 further includes a heating element 24 that is utilized to heat the chamber 16 to elevated temperatures. For example, the heating element 24 may be capable of heating the chamber 16 containing the component 10 and additional contents, as described below, to a temperature of about 2000° F. It will be appreciated that the retort is in fluid communication with a vacuum system 20. By way of example, the vacuum system 20 may include a liquid-ring vacuum pump. This type of pump may be capable of attaining vacuum pressures of about 120 Torr or so depending upon the liquid used in the vacuum pump. It will be appreciated that the pressure in the chamber 16 may reduced to or approach the vapor pressure of the liquid at which pressure the liquid in the pump begins to boil. By way of example, one such liquid is ethylene glycol. Other suitable liquids include propylene glycol or the sugars of ethylene glycol or propylene glycol or other similar chemicals capable of reacting with acids to form metal hydroxides. These liquids may neutralize many of the gases that evolve from the materials in the CVD system 18, as described below. In one embodiment, the pH of the liquid is monitored and is adjusted as necessary to maintain the pH in the range of about 9 to about 10 to neutralize gases that become trapped therein. The pump liquid is periodically removed and recycled.

In addition, the system 18 may also include an inert gas supply 22 to introduce inert gases into the chamber 16. These gases are in addition to the gases that evolve as a result of heating other materials inside the chamber as is described below. By way of example, suitable inert gases include argon or nitrogen of 99% purity and may be used to initially purge the chamber and/or to maintain the chamber at a given process pressure. The inert gas may be used to displace other, more reactive gases, such as oxygen, from the chamber 16. The amount of oxygen in the chamber 16 may be less than the standard atmospheric partial pressure of oxygen. In one embodiment, oxygen may not be present in significant quantities or may be intentionally excluded, particularly in the repairing of turbine engine components. In one embodiment, the partial pressure of oxygen is about 2 ppm or less though higher amounts may be tolerated depending upon the metal of the braze alloy and the metallic component, as well as, the application for which the metallic component 10 is to be used. A pressure sensor (not shown) may be positioned in the retort to detect leakage into or out of the retort 16 and serve as an indicator of possible oxygen contamination. In one embodiment of the present invention, the process as set forth above is performed at pressures of between about 0.1 psi and about 10 psi positive to atmospheric pressure, which is approximately 15.1 psi to about 25 psi absolute pressure.

In addition to placement of the metallic component 10 within the chamber 16, a cleaning reagent 26 and/or a metal-containing salt 28 is/are also placed within the chamber 16. The reagent 26 and salt 28 may be in liquid or powder form and can be placed in separate crucibles 30, 32 for placement into the system 18. It will be appreciated that crucible material should not react with the reagent 26 or the salt 28 during heating to avoid possible contamination of the metallic wetting layer 14 with materials from the crucibles 30, 32. One suitable crucible material is alumina ($Al_2O_3$). Suitable high purity alumina crucibles (e.g., 99+% by weight) are commercially available from CoorsTek, Inc. of Golden, Colo.

When used in the process, the cleaning reagent 26 includes a compound or material that dissociates or pyrolyzes at a temperature lower than the temperature at which the metallic salt 28 pyrolyzes or dissociates. The cleaning reagent 26 may be a solid or liquid that, upon pyrolysis, supplies a cleaning constituent to the environment surrounding and contacting (as shown by the arrows) the component 10. The cleaning constituent, as a gas, is capable of reacting and removing contamination from all of the exposed surface, including crack surfaces, of the metallic component 10. For example, the cleaning constituent may remove residual organic materials or other surface impurities that may interfere with or contaminate the subsequent deposition of metal. In one embodiment, the cleaning constituent evolves from the reagent 26 at a temperature of less 2000° F. For example, hydrogen gas may evolve from the reagent 26 such that hydrogen cleaning of the metallic part 10 is performed. By way of further example, the reagent may evolve the cleaning constituent at a temperature between 900° F. and 1850° F. For example, one suitable reagent is ammonium chloride ($NH_4Cl$), which boils at about 968° F. The ammonia molecule that evolves from $NH_4Cl$ undergoes pyrolysis and releases hydrogen at about 1100° F. While the residual nitrogen from the pyrolysis of the ammonia is thought to be inert, the hydrogen cleans at least some residual contamination from the surface of the metallic component 10, as set forth above. Other suitable reagents include, but are not limited to, ammonium fluoride ($NH_4F$), ammonium bifluoride ($NH_4HF_2$), and hydrazine.

The metal-containing salt 28 is placed in the chamber 16, either alone or in combination with the cleaning reagent 26 as described above. In the embodiment of the process including cleaning in combination, once cleaning is complete, and upon further heating to higher temperatures, the salt 28 supplies the metal element for deposition of a metallic coating. When not combined with cleaning, the heating is simply to the higher temperature at which the salt 28 supplies the metal element for deposition of the metallic coating. Accordingly, in one embodiment, the metallic wetting layer 14 consists essentially of the metal from the salt 28. However, it will be appreciated that other elements, such as impurities from the salt 28, may be found in the metallic wetting layer 14. In addition, other metals may be intentionally included in the metallic wetting layer 14 by addition of their respective metal salts to the CVD chamber 16 prior to heating. By way of example, the salt 28 may be a reagent grade chemical or other graded chemical with a predetermined purity. Thus, impurity content of the metal-containing salt or impurities from the furnace are contemplated in amounts that do not affect the wettable characteristics of the layer or its performance when used in a specific application.

According to one embodiment of the invention, the metal-containing salt 28 melts at a certain temperature, if it is a solid at room temperature, and then boils at another, higher temperature. If used in combination with the cleaning reagent 26, the metal-containing salt 28 dissociates or pyrolyzes at a temperature that is greater than that of the reagent 26, as set forth above. For example, one suitable metal salt is nickel II chloride ($NiCl_2$), which boils at a temperature of about 1783° F. It will be appreciated that the melting temperature and boiling temperature of the metal-containing salt will at least depend on the metal-containing salt selected. In that regard, however, the temperatures at which the metal-containing salt boils is less than the melting temperature of the component 10 and may be less than a temperature that causes appreciable changes to the microstructure of the metal of the component 10 over short periods of time. By way of additional example, other suitable metal-containing salts include chromium II chloride, chromium III chloride, or fluoride salts of these same metals. However, one of ordinary skill will observe that there are several salts that may work according to the principles disclosed herein, including, for example, bromide and iodide salts of the above metals.

In view of the above, upon heating the contents of a chamber 16, which contains the component 10, the reagent 26, and the salt 28, the reagent 26 first supplies a gas that cleans contaminates from the surface of the component 10 prior to depositing the metal. Following cleaning and with continued heating to raise the temperature of the retort 16 and its contents, or in the process skipping the cleaning step, to a temperature at which the salt 28 pyrolyzes or otherwise dissociates into its component constituents to supply the metal for the metal coating. The salt 28 boils to supply a metal-containing salt gas to the chamber 16. The gas, when it contacts the surface of the metal component, breaks down and the metal of the metal-containing salt deposits on the surface of the component 10 to form the metal coating. In one embodiment, the component 10 is preferably not removed from the chamber 16 or otherwise exposed to atmospheric contamination following cleaning but prior to depositing.

Following deposition of the metal coating, the component 10 may be further heated to a temperature sufficient to cause a portion of the metal coating to diffuse into the surface of the component thereby forming the metallic wetting layer 14. However, it will be appreciated that, depending upon the temperature and the materials involved, diffusion of the metal into the metal component 10 may occur simultaneously with the deposition of the metal from the salt 28 onto the component 10. In such a case, no additional heating or soaking may be required to produce the metallic wetting layer 14.

In one exemplary embodiment, the chamber 16 is initially evacuated via the vacuum system 20 and then backfilled with an inert gas from the inert gas supply 22. This process of evacuating and back filling may be performed multiple times, for example, six to eight times, to reduce the presence of unwanted gases in the chamber 16. Following evacuating and backfilling, a single heating cycle may include heating from room temperature to an elevated temperature at a predetermined rate. During heating to the elevated temperature, the temperature of the furnace 16 passes through a temperature range where cleaning takes place and then passes through a separate temperature range where the metal deposits. The heating cycle may optionally include soaking the component 10 and metal coating to diffuse the coating thereto. The rate of temperature increase and the set temperature may vary according to the particular application. For example, setting a single target temperature of 1900° F. and heating the contents of the retort chamber 16 to that temperature may be sufficient to clean and then deposit a nickel metal coating when using ammonium chloride and nickel II chloride for repairing the cracks in a turbine engine component. A four hour soak at a temperature of 1975° F. may allow the nickel to diffuse into the surface of the component 10.

Embodiments of the present invention are more environmentally friendly than comparable plating techniques. These plating operations, such as, nickel or nickel-alloy plating, include placing a part in a liquid that contains nickel, and/or possibly other metals, and using an electrochemical technique to cause the nickel to plate onto the part. It is known that these techniques produce an interface between the plated metal and bulk metal that is discrete. As such, the plated metal may peel when subject to severe service conditions. Unlike prior art plating operations, according to embodiments of the present invention, the metallic wetting layer 14 is formed on a metallic component 10 in an environmentally friendly manner, without substantial emissions of harmful or toxic elements, and without a substantial waste stream and may be diffusion bonded to the component 10. In one embodiment, following diffusion, a braze alloy may be used to braze the component 10 to a metal part and/or cracks in the surface of the component 10 may be filled with a braze alloy and then heated to fill the cracks with braze alloy. During brazing, the constituents of the braze alloy diffuse into the previously diffused nickel layer.

As is determinable by methods known in the art, the amount of the reagent 26, when used, and metal-containing salt 28 placed within the retort 16 should be sufficient to remove contamination and coat the exposed surfaces of the metallic component 10 and the retort 16 to a thickness sufficient with metal to produce the desired thickness of the metallic wetting layer 14. For example, in processes that include refurbishing turbine engine components that contain cracks, the amount of cleaning reagent 26 should be sufficient to expose and clean all of the surfaces, including the crack surfaces, of the component and furnace. Upon further heating, and following completion of cleaning, the metal salt pyrolyzes. The amount of the metal salt 28 should be sufficient to coat the exposed surfaces of the component 10 with a desired thickness of the metal. By way of example, where the cleaning reagent is ammonium chloride, the amount of ammonium chloride may be in the range of about 1.0 g to about 25 g per liter of retort volume, the resulting amount of the nickel chloride may be sufficient to produce a nickel wetting layer of less than 0.001 inches thick. After diffusion, these layers do not exhibit a defined demarcation line between the Ni wetting layer and the bulk metal. Furthermore, it is desirable to cause a weight gain, though in certain instances a weight loss may be observed depending upon whether the metal component 10 is subject to cleaning immediately prior to depositing the metal coating In one embodiment, an additional chamber (not shown) or container is placed within the retort 16. The component 10, reagent 26, and metal salt 28 are placed within the container. It will be appreciated that this container effectively reduces the volume of the retort 16 and improves the cleaning and deposition efficiency. Furthermore, the container may be easily replaced with another chamber of a different material. For example, the material selection of the container may depend on the composition of the component 10. Where iron (Fe) is to be excluded from the component 10, the container may be made of Nickel 200. And, if iron is acceptable in the metallic wetting layer 14, containers made of Haynes® HR-120, Inconel® 600, or Inconel® 601 may be used. In one exemplary embodiment that uses an additional container that is about 10 inches in diameter and about 6 inches in height, a turbine blade that fits therein may be cleaned with about 30 g of $NH_4Cl$ and coated with nickel with about 50 g of $NiCl_2$. In another exemplary embodiment, the amount of the $NH_4Cl$ is about 30 g per 7.7 L of the container volume and the amount of the $NiCl_2$ is about 15 g per 7.7 L of the container volume.

In addition, to prevent the metal coating from contacting portions of the component, a maskant may be used on those portions. This may be desirable where dimensional control is needed, such as on the fir trees or blade roots of jet engine turbine blades. By way of example, the maskant may be T-1567 made by Chromalloy Israel of Israel.

In addition to depositing a metal coating on the metallic component, as described above, the metal component 10 may be cleaned prior to depositing the metal coating. This may be the situation where, for example, a used metallic component is to be repaired and then reused. Cleaning of the metal component may entail first stripping any coatings, such as, oxide coatings and underlying metal coatings, if any, therefrom. For example, where the metal component 10 is a turbine engine component, metal oxide coatings may be stripped therefrom according to the process set forth in U.S. Pat. No. 6,294,072, which is incorporated by reference herein in its entirety. Continuing with the example, once any oxide coatings are removed from the component 10, any corrosion or sulfidation products found on the surfaces of or in any cracks or other surface irregularities may be removed by a dynamic FIC process or by the process disclosed in U.S. Pat. No. 7,846,261, which is also incorporated by reference herein in its entirety. In one embodiment, the component 10 is cleaned with ethylene-tetrafluoroethylene (EFTE), or another similar substance, according to the process described in U.S. Pat. No.

7,846,261, however, the component 10 may be placed on graphite either in the form of a powder bed or a sheet thereof during heating, which enhances the cleaning process.

In one embodiment, the components are used turbine engine components that contain cracks. According to one exemplary process of the present invention, the used component is initially subject to a process as described in U.S. Pat. No. 7,846,261. In one such process, the sulfidation deposits and/or dust particles on the surface, and particularly in the cracks, of the turbine engine component are removed by placing a halogen-containing organic compound in contact with the component and heating the component and compound to chemically react the sulfidation and/or dust particles with the compound. However, a black residue may often remain on the component following this process. This residue must be removed prior to processing according to embodiments of the present invention.

While some residue does not affect the cleaning and depositing as described above, failure to remove the residue may increase the amount of carbon in the final metallic wetting layer. In some applications, such as with turbine engine components, the carbon content of the component is monitored because it affects the mechanical properties thereof. In these instances, where it is desirable to limit the amount of carbon added by the repair process, the black residue may be removed by contacting it with an abrasive. Such an abrasive may include blasting the residue off with grit or with Ballotini beads. However, for turbine engine components, any abrasive residue from a grit blasting operation may be unacceptable. Therefore, in one embodiment, the black residue is removed by placing the components back into an aqueous stripping solution described in U.S. Pat. No. 6,294,072 followed by hand polishing the surface of the component with a Scotch-Brite® cloth or other abrasive that leaves little, if any, abrasive residue on the surface of the component.

Following polishing, the component may be dipped in, for example, a 10% hydrochloride acid (HCl) bath and then dried with compressed air to complete the initial cleaning of the stripped component. Once the initial cleaning is complete, the used turbine engine component is further processed y heating it within a chamber that includes the cleaning reagent 26 and the metal-containing salt 28 according to the embodiments of the invention described above.

Following treatment according to an embodiment of the present invention, the component may be removed from the chamber and a brazing alloy may be used to form a joint in contact with the metallic wetting layer. A brazing alloy may also be used to fill and repair cracks in the surface thereof.

While the present invention has been illustrated by a description of various embodiments and while these embodiments have been described in some detail, it is not the intention of the inventor to restrict or in any way limit the scope of the appended claims to such detail. Thus, additional advantages and modifications will readily appear to those of ordinary skill in the art. The various features of the invention may be used alone or in any combination depending on the needs and preferences of the user.

What is claimed is:

1. A method of forming a metallic wetting layer on the surface of a metal component, comprising:
    placing the component into a furnace;
    placing a cleaning reagent and a metal-containing salt in the furnace;
    heating the component, the cleaning reagent, and the metal-containing salt in the furnace to a first temperature to cause the cleaning reagent to evolve a cleaning constituent that at least partially reacts with contaminants on the surface of the component whereby the reacted contaminants are removed from the surface; and,
    following cleaning, further heating the component and the metal-containing salt to raise the temperature thereof to a second temperature greater than the first temperature to cause the metal-containing salt to evolve metal that deposits in a coating on the surface of the component, wherein the metal coating forms a metallic wetting layer capable of facilitating wetting of subsequent application of a brazing alloy.

2. The method of claim 1 further comprising:
    diffusing the metal coating into the component to form the metallic wetting layer.

3. The method of claim 1 wherein depositing the coating includes diffusing the metal into the surface of the component.

4. The method of claim 1 further comprising:
    brazing the metallic wetting layer with a brazing alloy.

5. The method of claim 1 wherein the cleaning reagent evolves hydrogen upon pyrolysis.

6. The method of claim 5 wherein the cleaning reagent pyrolyzes at a temperature of about 2000° F. or less.

7. The method of claim 1 wherein the cleaning reagent is selected from the group consisting of ammonium chloride, ammonium fluoride, ammonium biflouride, and hydrazine.

8. The method of claim 1 wherein the metal of the metal-containing salt is selected from the group consisting of nickel and chromium.

9. The method of claim 1 wherein the component is a used turbine engine component.

10. The method of claim 1 wherein the furnace is a sealed furnace to control the ambient gaseous environment surrounding the component and the amount of oxygen in the furnace is sufficiently low to limit the amount of oxides that form on the surface of the component upon heating.

11. The method of claim 1 wherein the furnace is a sealed furnace to control the ambient gaseous environment surrounding the component and the amount of oxygen in the furnace is held to about 2 ppm or less.

12. The method of claim 1 wherein the pressure in the furnace is reduced to about 120 Torr and then the furnace is backfilled with argon prior to heating.

13. A method of cleaning a used turbine engine component that contains cracks and that has been previously subject to a stripping process, comprising:
    polishing the surface of the turbine engine component, including the regions that contain the cracks;
    placing the turbine engine component into a furnace;
    placing a cleaning reagent and a metal-containing salt in the furnace;
    reducing the amount of oxygen in the furnace to less than the atmospheric partial pressure of oxygen;
    heating the component, the cleaning reagent, and the salt in the oxygen-reduced atmosphere of the furnace to a first temperature to cause the cleaning reagent to evolve a cleaning constituent that at least partially reacts with contaminants on the surface of the component whereby the reacted contaminants are removed from the surface; and,
    following cleaning, further heating the component and the salt to raise the temperature thereof to a second temperature greater than the first temperature to cause the metal from the metal-containing salt to deposit in a coating on the cleaned surface of the component, wherein the metal coating forms a metallic wetting layer capable of facilitating wetting of subsequent application of a brazing alloy.

14. A method of forming a metallic wetting layer on the surface of a metal component, comprising:
  placing the component into a furnace;
  placing a metal-containing salt in the furnace;
  heating the component and the metal-containing salt in the furnace to cause the metal from the metal-containing salt to deposit in a coating on the surface of the component, wherein the metal coating forms a metallic wetting layer capable of facilitating wetting of subsequent application of a brazing alloy; and
  prior to heating the component and the metal-containing salt, placing a cleaning reagent in the furnace such that during heating, the cleaning reagent evolves a cleaning constituent that at least partially reacts with contaminants on the surface of the component whereby the reacted contaminants are removed from the surface.

15. The method of claim 14 further comprising:
  diffusing the metal coating into the component to form the metallic wetting layer.

16. The method of claim 14 wherein heating the component includes diffusing the deposited metal into the surface of the component.

17. The method of claim 14 further comprising:
  contacting the metallic wetting layer with a brazing alloy.

18. The method of claim 14 wherein the cleaning reagent evolves hydrogen upon dissociation.

19. The method of claim 18 wherein the cleaning reagent dissociates at a temperature of about 2000° F. or less.

20. The method of claim 14 wherein the cleaning reagent is selected from the group consisting of ammonium chloride, ammonium fluoride, ammonium biflouride, and hydrazine.

21. The method of claim 14 wherein the metal of the metal-containing salt is selected from the group consisting of nickel and chromium.

22. The method of claim 14 wherein the component is a used turbine engine component.

23. The method of claim 14 wherein the furnace is a sealed furnace to control the ambient gaseous environment surrounding the component and the amount of oxygen in the furnace is sufficiently low to limit the amount of oxides that form on the surface of the component upon heating.

24. The method of claim 14 wherein the furnace is a sealed furnace to control the ambient gaseous environment surrounding the component and the amount of oxygen in the furnace is held to about 2 ppm or less.

25. The method of claim 14 wherein the pressure in the furnace is reduced to about 120 Torr and then the furnace is backfilled with argon prior to heating.

26. The method of claim 14 wherein the metallic wetting layer produced is less than 0.001 inches thick.

27. The method of claim 14 further comprising:
  prior to placing the component in the furnace applying a maskant to a portion of the component to prevent the metal coating from contacting such portion.

* * * * *